United States Patent
Sakai et al.

(10) Patent No.: US 10,454,008 B2
(45) Date of Patent: Oct. 22, 2019

(54) RESIN COMPOSITION, REFLECTOR, LEAD FRAME WITH REFLECTOR, AND SEMICONDUCTOR LIGHT-EMITTING DEVICE

(71) Applicant: DAI NIPPON PRINTING CO., LTD., Tokyo (JP)

(72) Inventors: Toshiyuki Sakai, Tsukubamirai (JP); Kei Amagai, Tsukuba (JP); Satoru Kanke, Tsukuba (JP); Aki Kimura, Tsukuba (JP); Toshimasa Takarabe, Tokyo (JP); Katsuya Sakayori, Fujimino (JP); Tomoki Sasou, Kawasaki (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 0 days.

(21) Appl. No.: 15/111,081

(22) PCT Filed: Jan. 13, 2015

(86) PCT No.: PCT/JP2015/050700
§ 371 (c)(1),
(2) Date: Sep. 6, 2016

(87) PCT Pub. No.: WO2015/108043
PCT Pub. Date: Jul. 23, 2015

(65) Prior Publication Data
US 2016/0372645 A1    Dec. 22, 2016

(30) Foreign Application Priority Data

Jan. 14, 2014 (JP) ................................ 2014-004313

(51) Int. Cl.
*C08K 3/013* (2018.01)
*C08K 5/541* (2006.01)
(Continued)

(52) U.S. Cl.
CPC .............. *H01L 33/60* (2013.01); *C08K 3/013* (2018.01); *C08K 3/22* (2013.01); *C08K 3/36* (2013.01);
(Continued)

(58) Field of Classification Search
CPC ......... H10L 33/60; C08K 3/013; C08K 5/541; C08K 5/5425
(Continued)

(56) References Cited

U.S. PATENT DOCUMENTS 4,247,667 A    1/1981    Nojiri et al.
6,887,925 B1   5/2005    Kobayashi et al.
(Continued)

FOREIGN PATENT DOCUMENTS

CN    1769341 A    5/2006
CN    1993424 A    7/2007
(Continued)

OTHER PUBLICATIONS

Feb. 10, 2015 International Search Report issued in International Patent Application No. PCT/JP2015/050700.

*Primary Examiner* — Robert T Huber
(74) *Attorney, Agent, or Firm* — Oliff PLC (57) ABSTRACT

A resin composition including an olefin resin, an alkenyl-containing alkoxy silane compound, and at least one inorganic filler selected from the group consisting of titanium oxide, alumina, talc, clay, aluminum, aluminum hydroxide, mica, iron oxide, graphite, carbon black, calcium carbonate, zinc sulfide, zinc oxide, barium sulfate, and potassium titanate; a reflector using the resin composition; a reflector-bearing lead frame; and a semiconductor light-emitting device. Accordingly, provided by the present invention are: a resin composition capable of expressing an excellent heat resistance (especially heat distortion resistance) even when
(Continued)

it is made to a formed body; a reflector using the resin composition; a reflector-bearing lead frame; and a semiconductor light-emitting device.

17 Claims, 1 Drawing Sheet (51) Int. Cl.
*C08K 5/5425* (2006.01)
*H01L 33/60* (2010.01)
*C08K 3/22* (2006.01)
*C08K 3/36* (2006.01)
*C08K 7/14* (2006.01)
*C08K 5/5415* (2006.01)
*H01L 33/30* (2010.01)
*H01L 33/58* (2010.01)
*H01L 33/62* (2010.01)
*H01L 33/48* (2010.01)

(52) U.S. Cl.
CPC .......... *C08K 5/541* (2013.01); *C08K 5/5425* (2013.01); *C08K 7/14* (2013.01); *C08K 5/5415* (2013.01); *C08K 2003/2241* (2013.01); *H01L 33/30* (2013.01); *H01L 33/486* (2013.01); *H01L 33/58* (2013.01); *H01L 33/62* (2013.01); *H01L 2224/48091* (2013.01); *H01L 2224/48247* (2013.01); *H01L 2924/181* (2013.01)

(58) Field of Classification Search
USPC .......................................................... 257/98
See application file for complete search history.

(56) References Cited

U.S. PATENT DOCUMENTS

| | | | |
|---|---|---|---|
| 2005/0215676 A1 | 9/2005 | Kobayashi et al. | |
| 2007/0015893 A1* | 1/2007 | Hakuta | B32B 17/1055 528/34 |
| 2007/0254150 A1 | 11/2007 | Seino et al. | |
| 2010/0015493 A1* | 1/2010 | Adachi | H01M 8/0297 429/483 |
| 2010/0273927 A1* | 10/2010 | Taguchi | C08L 83/04 524/433 |
| 2011/0151163 A1* | 6/2011 | Bloom | C08K 3/22 428/36.9 |
| 2013/0079448 A1 | 3/2013 | Biscoglio | |
| 2013/0189525 A1* | 7/2013 | Nolan | B32B 9/041 428/414 |
| 2014/0167091 A1 | 6/2014 | Ogasawara et al. | |

FOREIGN PATENT DOCUMENTS

| | | |
|---|---|---|
| CN | 101143945 A | 3/2008 |
| CN | 102176360 A | 9/2011 |
| CN | 103435897 A | 12/2013 |
| JP | 2001-167635 A | 6/2001 |
| JP | 2004-010864 A | 1/2004 |
| JP | 2009-292864 A | 12/2009 |
| JP | 2011-195709 A | 10/2011 |
| JP | 2012-094845 A | 5/2012 |
| JP | 2012-180432 A | 9/2012 |
| JP | 2013-166926 A | 8/2013 |
| JP | 2013-532206 A | 8/2013 |
| JP | 2013-181123 A | 9/2013 |
| JP | 2013-219158 A | 10/2013 |
| WO | 01/09237 A1 | 2/2001 |

\* cited by examiner

RESIN COMPOSITION, REFLECTOR, LEAD FRAME WITH REFLECTOR, AND SEMICONDUCTOR LIGHT-EMITTING DEVICE

TECHNICAL FIELD

The present invention relates to a resin composition, a reflector, a reflector-bearing lead frame, and a semiconductor light-emitting device.

BACKGROUND ART

As to the method which has been conventionally used for mounting an electronic part onto a substrate or the like, a method has been employed wherein the electronic part is temporarily fixed on a substrate to which a solder is previously spotted at a prescribed position, and then, the electronic part is fixed by melting the solder by heating this substrate with an infrared beam, a hot air, or the like (reflow method). With this method, a mounting density of the electronic part on the substrate's surface can be increased.

However, it cannot be said that electronic parts which have been conventionally used have a sufficient heat resistance; especially in the reflow process using an infrared beam for heating, temperature of the part's surface increases locally, thereby causing a problem including generation of deformation thereof; and therefore, a resin composition and an electronic part having further higher heat resistance (especially heat distortion resistance) have been desired.

An LED element, one of semiconductor light-emitting devices, is so small in size with a long life, and is also excellent in saving of an electric power, so that this is widely used as a light source of a display lamp and so forth. Moreover, in recent years, because an LED element having a further higher luminance has been manufactured with a comparatively cheap cost, use of the LED element is being studied as a light source to replace a fluorescent lamp and an incandescent light bulb. When applying to the light source like this, in order to obtain a large luminance, widely employed is a method wherein a surface-mounting LED package is used, namely, a method wherein an LED element is disposed on a substrate which is made of a metal including aluminum and copper (lead frame), and also a reflector (reflecting body) which reflects a light to a prescribed direction is arranged around each LED element.

However, in the illuminating LED device using the method like this, because the LED element generates a heat when emitting a light, the reflector is deteriorated due to a temperature rise during the time of light emission of the LED element thereby causing a decrease in the reflectance thereof. As a result, the luminance thereof decreases, resulting in shortening of the life or the like of the LED element. Therefore, the reflector is required to have a heat resistance.

In order to satisfy the requirement in the heat resistance, in Patent Literature 1, a resin composition comprising (A) a fluorinated resin having a carbon-hydrogen bond and (B) titanium oxide is proposed. In Patent Literature 2, a resin composition for a reflector which includes polymethylpentene, white pigment, and spherical fused silica particle and/or modified cross-section glass fiber is proposed.

CITATION LIST

Patent Literature

PTL 1: Japanese Patent Laid-Open Publication No. 2011-195709
PTL 2: Japanese Patent Laid-Open Publication No. 2012-180432

SUMMARY OF INVENTION

Technical Problem

However, with regard to the resin compositions described in Patent Literature 1 and Patent Literature 2, the heat distortion resistances thereof have not been investigated. In addition, in the resin composition containing fluorine such as the one in Patent Literature 1, in the course of hardening thereof, poisonous gases including hydrogen fluoride are generated by a heat or a radiation ray, so that this composition cannot be practically used in view of pollution in environment.

In view of the above-mentioned, the present invention has an object to provide: a resin composition capable of expressing an excellent heat resistance (especially heat distortion resistance) even when it is molded to a formed body; a reflector using the resin composition; a reflector-bearing lead frame; and a semiconductor light-emitting device.

Solution to Problem

Inventors of the present invention carried out an extensive investigation to achieve the object described above; and as a result, it was found that the object can be achieved by the invention described below. Namely, the present invention is as follows.

[1] A resin composition including an olefin resin, an alkenyl-containing alkoxy silane compound, and at least one inorganic filler selected from the group consisting of titanium oxide, alumina, talc, clay, aluminum, aluminum hydroxide, mica, iron oxide, graphite, carbon black, calcium carbonate, zinc sulfide, zinc oxide, barium sulfate, and potassium titanate.

[2] The resin composition according to [1], wherein the olefin resin is at least any one of polyethylene, polypropylene, and polymethylpentene.

[3] The resin composition according to [1] or [2], wherein the alkenyl-containing alkoxy silane compound is a trialkoxy silane containing an alkenyl group with a carbon number of 1 to 20.

[4] The resin composition according to any one of [1] to [3], wherein the composition further includes silica.

[5] The resin composition according to any one of [1] to [4], wherein the composition further includes a flow improver.

[6] A reflector including a hardened material of the resin composition according to any one of [1] to [5].

[7] A reflector-bearing lead frame including a hardened material of the resin composition according to any one of [1] to [5].

[8] A semiconductor light-emitting device, wherein
the semiconductor light-emitting device has on a substrate thereof an optical semiconductor element and a reflector which is arranged around the optical semiconductor element and reflects a light from the optical semiconductor element to a prescribed direction, and
a light reflecting surface of the reflector includes a hardened material of the resin composition according to any one of [1] to [5].

Advantageous Effects of Invention

According to the present invention, provided are: a resin composition capable of expressing an excellent heat resistance (especially heat distortion resistance) even when it is made to a formed body; a reflector using the resin composition; a reflector-bearing lead frame; and a semiconductor light-emitting device.

DESCRIPTION OF EMBODIMENTS

[1. Resin Composition]

The resin composition of the present invention includes an olefin resin, an alkenyl-containing alkoxy silane compound, and at least one inorganic filler selected from the group consisting of titanium oxide, alumina, talc, clay, aluminum, aluminum hydroxide, mica, iron oxide, graphite, carbon black, calcium carbonate, zinc sulfide, zinc oxide, barium sulfate, and potassium titanate. According to the resin composition of the present invention, owing to the silane compound, a dispersibility of the inorganic filler into the olefin resin can be enhanced, and also an excellent light resistance can be obtained.

Meanwhile, the resin composition of the present invention is preferably used as an electron beam-hardenable resin composition which can be hardened by an electron beam. The resin composition of the present invention has the alkoxy group showing a dehydration condensation reaction with the inorganic filler after hydrolysis thereof, as well as a double bond having a reactivity with the resin; and therefore, when it is made to the electron beam-hardenable resin composition, the irradiation dose of the electron beam can be made smaller. As a result, a damage to the resin can be reduced, and also the irradiation time can be made shorter.

Hereunder, the resin composition of the present invention will be explained.

(Olefin Resin)

The olefin resin herein is a polymer having a constitution unit formed of a carbon-carbon bond in the main chain thereof, while in a certain instance the olefin resin may contain a cyclic structure in the carbon bond. The olefin resin may be a homopolymer, or a copolymer which is formed by copolymerization with other monomer. Because the carbon-carbon bond does not undergo a hydrolysis reaction, the olefin resin has an excellent water resistance. Illustrative example of the olefin resin includes: a resin obtained by ring-opening metathesis polymerization of a norbornene derivative or a hydrogenated product thereof; a homopolymer of each olefin including ethylene and propylene; an ethylene-propylene block copolymer or an ethylene-propylene random copolymer; a copolymer of ethylene and/or propylene with other olefin including butene, pentene, and hexene; and a copolymer of ethylene and/or propylene with other monomer including vinyl acetate. Among of them all, polyethylene, polypropylene, and polymethylpentene are preferable, while polymethylpentene is more preferable.

The polyethylene herein may be a homopolymer of ethylene, or may also be a copolymer of ethylene with other comonomer copolymerizable with ethylene (for example, α-olefin including propylene, 1-butene, 1-hexene, and 1-octene; vinyl acetate, vinyl alcohol, and the like). Illustrative example of the polyethylene resin includes a high-density polyethylene (HDPE), a medium-density polyethylene (MDPE), a low-density polyethylene (LDPE), a linear low-density polyethylene (LLDPE), a very low-density polyethylene (VLDPE), an ultrahigh molecular weight polyethylene (UHMWPE), and a crosslinked polyethylene (PEX). These polyethylenes may be used singly or as a combination of two or more of them.

The polypropylene herein may be a homopolymer of propylene, or may also be a copolymer of propylene with other comonomer copolymerizable with propylene (for example, α-olefin including ethylene, 1-butene, 1-hexene, and 1-octene; vinyl acetate, vinyl alcohol, and the like). These propylenes may be used singly or as a combination of two or more of them.

With regard to the polymethylpentene, a homopolymer of 4-methylpentene-1 is preferable; however a copolymer of 4-methylpentene-1 with other α-olefin with the carbon number of 2 to 20 may also be allowed, wherein the copolymer includes mainly 4-methylpentene-1 with the content of 4-methyl-1-pentene therein being 90% or more by mole. Illustrative example of the other α-olefin includes ethylene, propylene, 1-butene, 1-pentene, 1-hexene, 1-octene, 1-decene, 1-dodecene, 1-tetradecene, 1-octadecene, 1-eicosene, 3-methyl-1-butene, and 3-methyl-1-pentene.

Molecular weight of the homopolymer of 4-methylpentene-1 measured by a gel permeation chromatography is preferably 1,000 or more, while especially preferably 5,000 or more, as the weight-average molecular weight Mw, the value of which is a converted value from a polystyrene standard.

Refractive index of the olefin resin is lower as compared with general resins; and therefore, when it is combined with a material having a high refractive index such as titanium oxide particle, the difference in the refractive indexes can be made larger, so that the reflectance can be increased effectively. Refractive index is about 1.53 for polyethylene, about 1.48 for polypropylene, and about 1.46 for polymethylpentene; and therefore, polymethylpentene is more preferable.

When an aromatic ring is present in the resin structure, a colored component is prone to be formed by absorption of an ultraviolet beam. Because formation of the colored component causes a decrease in the light reflectance, it is preferable that the number of the aromatic ring in the resin structure be smaller, while more preferably, substantially there is no aromatic ring contained therein. In considering these aspects, the use thereof, for example, as a reflector of a semiconductor light-emitting device is appropriate.

(Alkenyl-Containing Alkoxy Silane Compound)

The resin composition of the present invention includes an alkenyl-containing alkoxy silane compound. The number of carbons in the organic chain thereof is preferably in the range of 1 to 20; however, because an increase in the number of carbons contained therein causes a decrease in hardness and density, the number of carbons contained therein is more preferably in the range of 1 to 10.

With regard to the alkenyl-containing alkoxy silane compound, a trialkoxy silane having an alkenyl group with the number of carbons contained therein being in the range of 1 to 20 is preferable, while a trialkoxy silane having an alkenyl group with the number of carbons contained therein being in the range of 1 to 10 is more preferable. Illustrative example of the alkoxy silane compound like this includes vinyl trimethoxy silane, vinyl triethoxy silane, propenyl trimethoxy silane, propenyl triethoxy silane, butenyl trimethoxy silane, butenyl triethoxy silane, pentenyl trimethoxy silane, pentenyl triethoxy silane, hexenyl trimethoxy silane, hexenyl triethoxy silane, heptenyl trimethoxy silane, heptenyl triethoxy silane, octenyl trimethoxy silane, octenyl triethoxy silane, nonenyl trimethoxy silane, nonenyl triethoxy silane, decenyl trimethoxy silane, decenyl triethoxy silane, undecenyl trimethoxy silane, undecenyl triethoxy silane, dodecenyl trimethoxy silane, and dodecenyl triethoxy silane. Among of them all, vinyl trimethoxy silane and octenyl trimethoxy silane are preferable.

Content of the alkenyl-containing alkoxy silane compound relative to 100 parts by mass of the olefin resin is preferably in the range of 0.1 to 20 parts by mass, more preferably in the range of 0.5 to 10 parts by mass, while still more preferably in the range of 1 to 7 parts by mass. When the content thereof is made in the range of 1 to 7 parts by mass, a filler can be dispersed into the resin. Namely, dispersibility of an inorganic filler into the olefin resin is improved by the silane compound described above, so that excellent reflectance and light resistance can be expressed. In the alkoxy silane compound, too, smaller number of the aromatic ring is preferable, while absence of the aromatic ring is more preferable.

(Inorganic Filler)

Further, the resin composition of the present invention includes at least one inorganic filler selected from the group consisting of titanium oxide, alumina, talc, clay, aluminum, aluminum hydroxide, mica, iron oxide, graphite, carbon black, calcium carbonate, zinc sulfide, zinc oxide, barium sulfate, and potassium titanate. Especially, preferably the resin composition includes a white pigment. By including the white pigment, the resin composition can be used for a reflector and so forth. As to the white pigment, titanium oxide, zinc sulfide, zinc oxide, barium sulfate, potassium titanate, or the like may be used singly or as a mixture of them; and among of them all, titanium oxide is preferable.

The shape of the inorganic filler is not particularly restricted. Illustrative example of the usable shape includes a granule-like shape, a fiber-like shape, a modified cross-section fiber-like shape, a shape having a large difference in projection and depression, and a flake-like shape with a thin thickness.

Content of the inorganic filler relative to 100 parts by mass of the olefin resin is preferably in the range of 10 to 600 parts by mass, more preferably in the range of 30 to 500 parts by mass, while still more preferably in the range of 50 to 450 parts by mass. When the content thereof is made in the range of 30 to 500 parts by mass, properties of a product of the resin composition (for example, light reflectance, strength, and molding warpage of the reflector) can be maintained properly. By so doing, difficulty in processing of the resin composition due to excess amount of the inorganic filler can be avoided; or even if the resin composition could be processed, deterioration in properties of the product thereof (for example, light reflectance of the reflector) due to poor molding condition can be avoided.

In considering moldability of the resin composition, the average particle diameter of the inorganic filler is, in a primary particle diameter distribution, preferably in the range of 0.01 to 100 μm, more preferably in the range of 0.05 to 10 μm, while still more preferably in the range of 0.10 to 1 μm. The average particle diameter can be obtained as the mass average value D50 in the particle diameter distribution measurement by a laser light diffraction method.

(Other Component)

The resin composition may include an inorganic filler other than the inorganic filler of the present invention so far as the properties of the resin composition are not impaired.

With regard to the other inorganic filler, an inorganic filler which is usually blended with a thermoplastic resin composition or with a thermosetting resin composition of a resin such as an epoxy resin, an acryl resin, and a silicone resin may be used singly or as a mixture of them. The shape and the particle diameter of the other inorganic filler is not particularly restricted. Illustrative example of the usable shape thereof includes a granule-like shape, a fiber-like shape, a modified cross-section fiber-like shape, a shape having a large difference in projection and depression, and a flake-like shape having a thin thickness. Specifically, silica is used; and silica particle, glass fiber, and the like are preferably used as silica, while the resin composition containing glass fiber is more preferable. The average particle diameter of the silica particle is preferably in the range of 0.01 to 1000 μm, more preferably in the range of 0.1 to 200 μm, while still preferably in the range of 1 to 100 μm. Also, the average length of the glass fiber (fiber length) is preferably in the range of 5 to 3000 μm, more preferably in the range of 20 to 200 μm, while still more preferably in the range of 40 to 100 μm. When the average particle diameter and the fiber length are made within these ranges, more amount of the fiber-like material can be filled into a formed body, so that the strength of the formed body can be enhanced.

Meanwhile, the fiber length can be obtained by the method as following: after a mixture is incinerated at 600° C. for 2 hours in an electric furnace, a residual matter is dispersed into a solution, and this disperse solution is dried on a slide glass, which is then followed by photographing with a microscope, and further followed by processing with an image analysis software.

Content of the other inorganic filler relative to 100 parts by mass of the olefin resin is preferably in the range of 10 to 300 parts by mass, more preferably in the range of 30 to 200 parts by mass, while still more preferably in the range of 50 to 120 parts by mass.

In addition, the resin composition of the present invention preferably includes a flow improver. When the flow improver is included therein, moldability of the resin can be enhanced. Illustrative example of the flow improver includes triallyl isocyanurate, monoglycidyl diallyl isocyanurate, diglycidyl monoallyl isocyanurate, trimethallyl isocyanurate, monoglycidyl dimethallyl isocyanurate, diglycidyl monomethallyl isocyanurate, triallyl cyanurate, monoglycidyl diallyl cyanurate, diglycidyl monoallyl cyanurate, trimethallyl cyanurate, monoglycidyl dimethallyl cyanurate, diglycidyl monomethallyl cyanurate, allyl glycidyl amine, diallyl monoglycidyl amine, monoallyl diglycidyl amine, monoglycidyl dimethallyl amine, diglycidyl monomethallyl amine, glycidyl allyl chlorendate, allyl glycidyl adipate, allyl glycidyl carbonate, allyl glycidyl dimethyl ammonium chloride, allyl glycidyl fumarate, allyl glycidyl isophthalate, allyl glycidyl malonate, allyl glycidyl oxalate, allyl glycidyl phthalate, allyl glycidyl propyl isocyanurate, allyl glycidyl sebacate, allyl glycidyl succinate, allyl glycidyl terephthalate, and glycidyl methylallyl phthalate. Content of the flow improver relative to 100 parts by mass of the olefin resin is preferably in the range of 0.1 to 30 parts by mass, while more preferably in the range of 1 to 20 parts by mass.

Meanwhile, the flowability of the resin composition can be evaluated by a melt volume rate (MVR). MVR is measured by the method according to the method described in JIS K 7210:1999 under "MVR of a thermoplastic resin". Specifically, the measurement is made with the testing temperature of 240° C., the testing load of 2.16 kg, and the duration time of 60 seconds. As to the measurement apparatus thereof, a melt flow tester manufactured by CEAST Inc. may be used.

Meanwhile, the resin composition may include various additives, so far as the effects of the present invention are not impaired by inclusion thereof. For example, in order to improve properties of the resin composition, an additive may be blended which includes: an internal mold release agent including various kinds of whisker, silicone powder, a thermoplastic elastomer, an organic synthetic rubber, a fatty acid ester, a glyceric acid ester, zinc stearate, and calcium stearate; an antioxidant including a benzophenone type, a salicylic acid type, a cyanoacrylate type, an isocyanurate type, an oxalic anilide type, a benzoate type, a hindered amine type, a benzotriazole type, and a phenol type; a light stabilizer including a hindered amine type and a benzoate type; and a heretofore known crosslinking agent; and the like.

It should be noted here that the resin composition of the present invention has an inorganic filler, and an alkoxy group showing a dehydration condensation reaction with the inorganic filler after hydrolysis thereof, and a double bond having a reactivity with the resin, so that the resin composition can express an excellent heat resistance even if a crosslinking agent is not included therein.

The resin composition of the present invention can be produced by mixing the olefin resin, the alkenyl-containing alkoxy silane compound, the inorganic filler, and as the case may be, other fillers, in accordance with a prescribed ratio.

Mixing of them may be made by a heretofore known method using a machine including: a stirring machine including a twin roll, a triple roll, a homogenizer, and a planetary mixer; and a melt kneading machine including PolyLab System and Labo Plastomill. The mixing may be made under any condition, i.e., at a normal temperature, in a cooled state, in a heated state, at a normal pressure, in an evacuated state, and in a pressurized state.

By using the resin composition of the present invention, various formed bodies can be formed, so that a formed body having a further thinner thickness (for example, a reflector) may also be produced. When the resin composition of the present invention is made to the electron beam-hardenable resin composition, the formed body according to the present invention is preferably produced, for example, by the method as described below.

Namely, the production thereof is made preferably by an injection molding process wherein the resin composition of the present invention is injection molded with the cylinder temperature of 200 to 400° C. and the die temperature of 20 to 150° C. Further, it is preferable to carry out a hardening process with any method after the injection molding process. For example, a process including an electron beam irradiation process in which an electron beam irradiation process is carried out may be mentioned.

The acceleration voltage of the electron beam can be arbitrarily chosen in accordance with the kind of the resin to be used and the layer thickness thereof. For example, in the case of the formed body whose thickness is about 1 mm, hardening of an unhardened resin layer is generally carried out with the acceleration voltage of preferably in the range of about 250 to 3000 kV. Meanwhile, in irradiation of an electron beam in the case that a substrate to be used is deteriorated by an electron beam, because a transmitting capability of the electron beam is higher with a higher acceleration voltage, by choosing the acceleration voltage such that the transmission depth of the electron beam may be substantially as same as the thickness of the resin layer, excessive irradiation of the electron beam to the substrate can be suppressed, so that the deterioration of the substrate due to an excessive electron beam can be minimized. The absorbed dose of the electron beam upon irradiation thereof can be arbitrarily set in accordance with composition of the resin composition, whereas the dose to saturate a crosslinking density of the resin layer is preferable; and thus, the irradiation dose is preferably in the range of 50 to 600 kGy.

The source of the electron beam is not particularly restricted, so that various electron beam accelerator can be used; and therefore, illustrative example of the usable accelerator includes a Cockcroft-Walton accelerator, a Van de Graafft accelerator, a resonance transformer, an insulated core transformer, a linear accelerator, a Dynamitron accelerator, and a high frequency accelerator.

The resin composition of the present invention described above can be applied for various uses as a composite material formed by coating the resin composition onto a substrate followed by hardening thereof, and as a hardened material of the resin composition. Illustrative example of the application thereof includes for a heat resistant insulating film, a heat resistant release sheet, a heat resistant transparent substrate, a light reflective sheet for a solar cell, an illumination including LED, and a reflector of a TV light source.

[2. Reflector]

The reflector of the present invention includes a hardened material which is formed by hardening the resin composition of the present invention as described above.

This reflector may be used in combination with a semiconductor light-emitting device described later, or may be used in combination with a semiconductor light-emitting device formed of other material.

The reflector of the present invention mainly acts to reflect a light from the LED element of a semiconductor light-emitting device toward a lens (light exiting portion). Details of the reflector are omitted here because this is the same as the reflector used in the semiconductor light-emitting device of the present invention (reflector 12 to be described later).

[3. Lead Frame]

The lead frame in the present invention is a substrate on which the reflector is mounted. Any lead frame can be used so far as it can be used in the field of a semiconductor light-emitting device. Illustrative example of the material for the lead frame includes alumina and ceramics composed of a sintered body of aluminum nitride, mullite, glass, or the like. Besides, a resin material or the like having flexibility, including a polyimide resin, may also be used. Especially as to the lead frame formed of a metal, aluminum, copper, or a copper alloy is used in many instances; and in addition, in order to enhance the reflectance thereof, the lead frame plated with a precious metal having a high reflectance, including silver, is used in many instances. Especially, a substrate for the reflector formed of a metal is called as the lead frame in many cases.

[4. Reflector-Bearing Lead Frame]

The reflector-bearing lead frame of the present invention is formed of a hardened material produced by molding the resin composition of the present invention. Specifically, the reflector-bearing lead frame according to the present invention is produced by molding the resin composition of the present invention to a lead frame so as to form a prescribed reflector shape by means of an injection molding.

Thickness of the reflector-bearing lead frame is preferably in the range of 0.1 to 3.0 mm, more preferably in the range of 0.1 to 1.0 mm, while still more preferably in the range of 0.1 to 0.8 mm.

In the resin composition of the present invention, a resin frame having further thinner thickness as compared with a resin frame which is produced, for example, by using a glass fiber can be produced. Specifically, a resin frame having the thickness of in the range of 0.1 to 3.0 mm can be produced. The reflector-bearing lead frame according to the present invention which is formed in the way as described above, does not generate a warpage due to a glass fiber filler or the like which is included therein even if the thickness thereof is made thin, and therefore, resulting in excellent properties in the shape stability and workability.

The reflector-bearing lead frame of the present invention is mounted with an LED chip thereon, which is followed by sealing with a heretofore known sealant and then further followed by die bonding to a prescribed shape, so that a semiconductor light-emitting device can be obtained. Meanwhile, the reflector-bearing lead frame of the present invention not only acts as a reflector but also functions as a frame to support a semiconductor light-emitting device.

[5. Semiconductor Light-Emitting Device]

Figure 1:
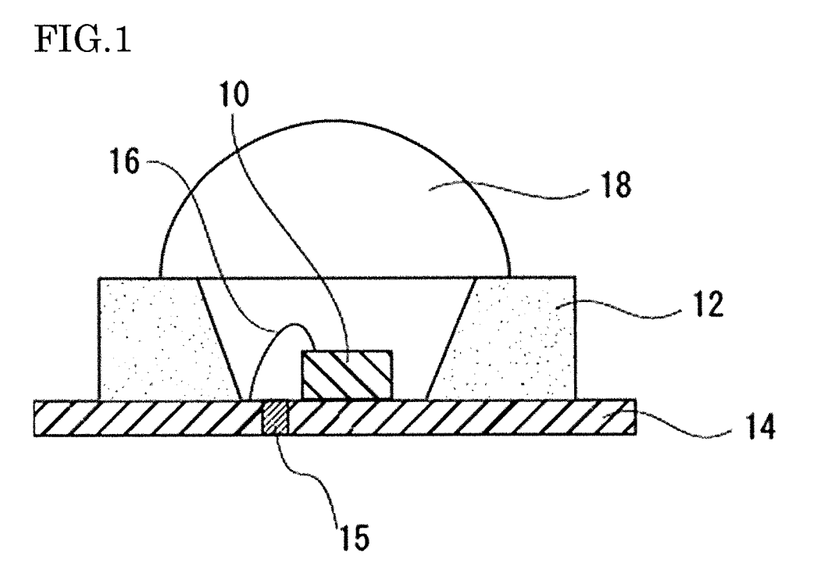
FIG. 1 is a rough cross section view illustrating an example of the semiconductor light-emitting device of the present invention.

In the semiconductor light-emitting device of the present invention, as illustrated in FIG. 1, the optical semiconductor element (for example, an LED element) 10 and the reflector 12 are formed on the substrate 14; the reflector 12 being arranged around the optical semiconductor element 10 and reflecting a light from the optical semiconductor element 10 to a prescribed direction. And, at least a part of a light-reflecting surface of the reflector 12 (in the case of FIG. 1, entire surface) is composed of a hardened material of the reflector composition described above.

The optical semiconductor element 10 is a semiconductor chip (light-emitting body) having a double hetero structure in which an active layer formed of, for example, AlGaAs, AlGaInP, GaP, or GaN is sandwiched by an n-type or a p-type clad layers, the active layer being the layer which emits a radiation light (generally, in a white LED, this light is a UV beam or a blue light), wherein the shape thereof is, for example, a hexahedron with the length of one side being about 0.5 mm. And, in the case of an embodiment of a wire bonding mounting, the optical semiconductor element 10 is connected with an electrode (connection terminal, which is not shown in the drawing) via a lead wire 16.

Meanwhile, an electric insulation to the electrode which is connected with the optical semiconductor element 10 and the lead wire 16 is retained by an insulating part 15 which is formed of a resin or the like.

The shape of the reflector 12 is in accordance with the edge part (bonding part) of the lens 18, and usually is tubular-like or ring-like with a shape of square, circle, ellipse, or the like. In the rough cross section view of FIG. 1, the reflector 12 has a tubular-like shape (ring-like shape) wherein entire of the edge surface of the reflector 12 contacts with and is fixed to surface of the substrate 14.

Meanwhile, an inner surface of the reflector 12 may be tapered to be wider in an upward direction so as to increase a directivity of a light from the optical semiconductor element 10 (see FIG. 1).

Also, the reflector 12 can function as a lens holder when the edge part thereof in the side of the lens 18 is processed in accordance with the shape of the lens 18.

Figure 2:
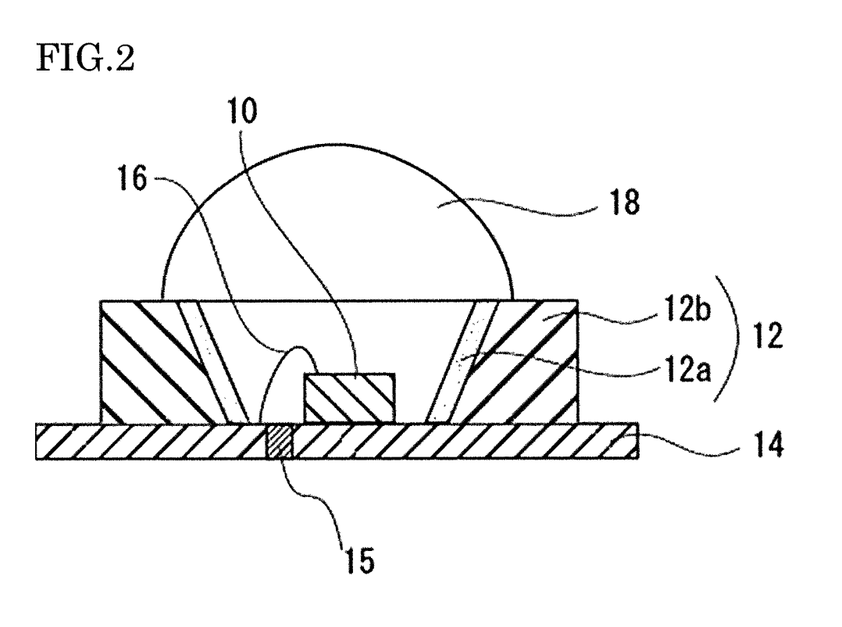
FIG. 2 is a rough cross section view illustrating an example of the semiconductor light-emitting device of the present invention.

In the reflector 12, as illustrated in FIG. 2, only the light reflecting side thereof may be made to the light reflecting layer 12a formed of the resin composition of the present invention. In this case, in view of lowering a thermal resistance or the like, thickness of the light reflecting layer 12a is made preferably 500 μm or less, while more preferably 300 μm or less. A member 12b to which the light reflecting layer 12a is formed may be composed of a heretofore known heat resistant resin.

As described above, the lens 18 is arranged on the reflector 12, wherein the lens 18 is usually made of a resin, and has various structures depending on the aim, the use, and the like thereof, and is sometimes colored.

The space part formed by the substrate 14, the reflector 12, and the lens 18 may be a transparent sealing part, or an empty part as the case may be. This space part is usually a transparent sealing part filled with materials that can render the light-transmitting and insulating capacities thereto. In a wire bonding mounting, the space part can prevent electric troubles from occurring, caused by a short-circuit or cutting of the lead wire 16, or by separation of the lead wire 16 from a connection part with the optical semiconductor element 10 and/or from a connection part with the electrode, wherein these troubles are caused by a force generated by a direct contact with the lead wire 16, as well as by a force generated by an indirect vibration, a shock, or the like. In addition, at the same time, this space part protects the optical semiconductor element 10 from humidity, dust, and the like, so that reliability of the device can be retained for a long period of time.

Usually, illustrative example of the material (transparent sealant composition) to render the transmitting and insulating capacities thereto includes a silicone resin, an epoxy silicone resin, an epoxy resin, an acryl resin, a polyimide resin, and a polycarbonate resin. Among them, a silicone resin is preferable in view of a heat resistance, a weather resistance, a low shrinkage, and a coloring resistance.

Hereunder, one example of the method for manufacturing the semiconductor light-emitting device which is illustrated in FIG. 1 will be explained.

To begin with, using the resin composition of the present invention as described above, the reflector 12 having a prescribed shape is formed by a transfer molding, a compression molding, an injection molding, or the like; the machines for these moldings being provided with a mold having a cavity space with the prescribed shape. Then, the optical semiconductor element 10, the electrode, and the lead wire 16, these having been prepared separately, are fixed to the substrate 14 by an adhesive or an adhering member. Next, the transparent sealant composition including a silicone resin is poured into the concavity formed by the substrate 14 and the reflector 12, which is then followed by heating, drying, and so forth for hardening the transparent sealant composition to make the transparent sealing part. Thereafter, the lens 18 is arranged on the transparent sealing part to obtain the semiconductor light-emitting device illustrated in FIG. 1.

Meanwhile, alternatively, after the lens 18 is mounted on the transparent sealant composition which is still under the unhardened state, the transparent sealant composition may be hardened.

EXAMPLES

Next, the present invention will be explained in more detail by Examples; however, the present invention is by no means limited by these Examples.

Meanwhile, materials used in Examples 1 to 8 and 10 to 15, and in Comparative Examples 1 to 6 are as following.

(Resins)
　Polymethylpentene: TPX RT18 (Manufactured by Mitsui Chemicals, Inc.)
　Polyethylene: HI-ZEX 1300 (manufactured by Prime Polymer Co., Ltd.)
　Polypropylene: Prime Polypro 137G (manufactured by Prime Polymer Co., Ltd.)
(Silane Compounds)
　7-Octenyl trimethoxy silane
　Vinyl trimethoxy silane
　3-Methacryloxypropyl trimethoxy silane
　3-Acryloxypropyl trimethoxy silane
　Hexyl trimethoxy silane
(Inorganic Filler)
　Titanium oxide: RF-691 (rutile structure with average particle diameter of 0.21 μm, manufactured by Ishihara Sangyo Kaisha, Ltd.)
(Other Inorganic Filler)
　Glass fiber: PE70E-001 (fiber length of 70 μm, manufactured by Nitto Boseki Co., Ltd.)
(Additive)
　Following additives were used.
　TAIC (trially isocyanurate, manufactured by Nihon Kasei Co., Ltd.)
　IRGANOX 1010 (manufactured by BASF Japan, Ltd.)
　PEP 36 (manufactured by ADEKA Corp.)
　SZ-2000 (manufactured by Sakai Chemical Industry Co., Ltd.)

Examples 1 to 8 and 10 to 15, and Comparative Examples 1 to 6

The materials shown in Table 1 to Table 3 below each were blended and kneaded to obtain a resin composition.

Meanwhile, the resin compositions for Evaluation 2 and Evaluation 3 were obtained by blending the respective materials, which was followed by the processes using an extrusion machine (MAX 30 with the dice diameter of 3.0 mm, manufactured by Nippon Placon Co., Ld.) and a pelletizer (MPETC 1, manufactured by Toyo Seiki Seisaku-sho, Ltd.).

Each of these resin compositions was press molded at 250° C. and at 20 MPa for 30 seconds to obtain a formed body (1) having the size of 750 mm×750 mm×0.5 mm (thickness).

An electron beam was irradiated to the formed body (1) with the acceleration voltage of 800 kV and with the absorbed dose of 400 kGy. Various properties of the formed bodies were evaluated (Evaluations 2 and 3). The results thereof are shown in Table 1 to Table 3 below.

(Evaluation 1)
　Pelletization
　For Evaluation 1, the resin composition was pelletized in the way as described below. To begin with, materials were weighed; and then, the materials each were mixed and kneaded by using PolyLab System (twin axial batch system) to obtain the resin composition. Thereafter, the resin composition was cut to produce pellets thereof. The results whether or not the palletization was possible are shown in Table 1 to Table 3 below.

Meanwhile, the reference character "A" in Tables shows that palletization could be made, and the reference character "B" shows that pellets could not be obtained.

(Evaluation 2)
　Heat Resistance
　Storage modulus of each specimen of the formed body (1) was measured by using RSAG 2 (manufactured by TA Instruments, Inc.) under the condition with the measurement temperature of 25 to 400° C., the temperature rising rate of 5° C./minute, and the strain of 0.1%. The storage modulus each at 270° C. are shown in Table 1 to Table 3 below.

(Evaluation 3)
　Heat Resistance
　Change in appearance (change in color) of each specimen of the formed body (1) was visually confirmed after treatment thereof at 150° C. for 24 hours. The results are shown in Table 1 to Table 3 below.

Meanwhile, in Tables, the reference character "A" shows that there was no change in appearance before and after the treatment described above, namely, there was no change in color; the reference character "B" shows that there was a slight change in color; and the reference character "C" shows that there was a change in appearance (change in color) after the treatment.

TABLE 1

|  |  | Example | | | | | | | |
|---|---|---|---|---|---|---|---|---|---|
|  |  | 1 | 2 | 3 | 4 | 5 | 6 | 7 | 8 |
| Blend (Parts by mass) | Polymethylpentene | 100 | 100 |  | 100 | 100 | 100 | 100 | 100 |
|  | Polyethylene |  |  | 100 |  |  |  |  |  |
|  | 7-Octenyl trimethoxy silane | 5 | 5 | 5 | 5 | 5 | 1 | 3 |  |
|  | Vinyl trimethoxy silane |  |  |  |  |  |  |  | 5 |
|  | 3-Methacryloxypropyl trimethoxy silane |  |  |  |  |  |  |  |  |
|  | 3-Acryloxypropyl trimethoxy silane |  |  |  |  |  |  |  |  |
|  | Hexyl trimethoxy silane |  |  |  |  |  |  |  |  |
|  | Titanium oxide | 200 |  | 200 | 600 |  | 200 | 200 | 200 |
|  | Glass fiber |  | 100 |  |  | 200 |  |  |  |
|  | EB irradiation dose | 300kGy | 300kGy | 300kGy | 300kGy | 300kGy | 300kGy | 300kGy | 300kGy |
| Evaluation results | Pelletization | A | A | A | A | A | A | A | A |
|  | Heat resistance (Pa @270° C.) | 2.2E+06 | 3.7E+06 | 2.9E+07 | 8.7E+07 | 9.8E+06 | 1.0E+06 | 1.0E+06 | 1.4E+06 |

TABLE 2

|  |  | Comparative Example | | | |
|---|---|---|---|---|---|
|  |  | 1 | 2 | 3 | 4 |
| Blend (Parts by mass) | Polymethylpentene | 100 | 100 | 100 | 100 |
|  | Polyethylene |  |  |  |  |
|  | 7-Octenyl trimethoxy silane |  |  |  |  |
|  | Vinyl trimethoxy silane |  |  |  |  |
|  | 3-Methacryloxypropyl trimethoxy silane |  | 5 |  |  |
|  | 3-Acryloxypropyl trimethoxy silane |  |  | 5 |  |
|  | Hexyl trimethoxy silane |  |  |  | 5 |
|  | Titanium oxide | 200 | 200 | 200 | 200 |
|  | Glass fiber |  |  |  |  |
|  | EB irradiation dose | 300 kGy | 300 kGy | 300 kGy | 300 kGy |
| Evaluation results | Pelletization | A | B | B | A |
|  | Heat resistance (Pa @270° C.) | 4.1E+05 | — | — | 4.0E+05 |

TABLE 3

|  |  | Example | | | | | | Comparative Example | |
|---|---|---|---|---|---|---|---|---|---|
|  |  | 10 | 11 | 12 | 13 | 14 | 15 | 5 | 6 |
| Blend (Parts by mass) | Polymethylpentene | 100 | 100 | 100 |  |  | 100 | 100 | 100 |
|  | Polyethylene |  |  |  | 100 |  |  |  |  |
|  | Polypropylene |  |  |  |  | 100 |  |  |  |
|  | 7-Octenyl trimethoxy silane | 7 | 7 | 7 | 7 | 7 |  |  |  |
|  | Vinyl trimethoxy silane |  |  |  |  |  | 7 |  | 7 |
|  | Titanium oxide | 450 | 450 | 450 | 450 | 450 | 450 | 450 | 450 |
|  | Glass fiber | 120 | 120 | 120 | 120 | 120 | 120 | 120 | 120 |
|  | TAIC |  | 20 | 20 | 20 | 20 | 20 |  |  |
|  | IRGANOX 1010 | 5 | 5 | 5 | 5 | 5 | 5 | 5 | 5 |
|  | PEP 36 | 0.5 | 0.5 | 0.5 | 0.5 | 0.5 | 0.5 | 0.5 | 0.5 |
|  | SZ-2000 | 0.5 | 0.5 | 0.5 | 0.5 | 0.5 | 0.5 | 0.5 | 0.5 |
|  | EB irradiation dose | 300kGy | 300kGy | 150kGy | 300kGy | 300kGy | 300kGy | 300kGy | 300kGy |
| Evaluation results | Pelletization | A | A | A | A | A | A | A |  |
|  | Heat resistance (Pa @270° C.) | 6.86E+07 | 6.46E+08 | 2.35E+08 | 1.48E+09 | 4.71E+08 | 3.17E+08 | 7.81E+04 |  |
|  | Heat discoloration resistance | — | A | A | — | — | B | A | C |

As can be clearly seen in the results of Examples described above, the resin composition according to the present invention could express an excellent heat distortion resistance even when it was made to a formed body. From the results shown above, it can be concluded that the resin composition of the present invention is useful as a reflector, as well as a reflecting material for a semiconductor light-emitting device.

REFERENCE SIGNS LIST

10 Optical semiconductor element
12 Reflector
14 Substrate
15 Insulating part
16 Lead wire
18 Lens

The invention claimed is:

1. A resin composition comprising:
an olefin resin that is at least any one of polypropylene, polymethylpentene, and a homopolymer of polyethylene,
a trialkoxy silane compound containing an alkenyl group with a carbon number of 1 to 20, and
at least one inorganic filler selected from the group consisting of titanium oxide, alumina, talc, clay, aluminum, aluminum hydroxide, mica, iron oxide, graphite, carbon black, calcium carbonate, zinc sulfide, zinc oxide, barium sulfate, and potassium titanate,
wherein the composition comprises 200 to 600 parts by mass of the inorganic filler relative to 100 parts by mass of the olefin resin.

2. The resin composition according to claim 1, wherein the resin composition further comprises silica.

3. The resin composition according to claim 1, wherein the resin composition further comprises a flow improver.

4. A reflector comprising a hardened material of the resin composition according to claim 1.

5. A reflector-bearing lead frame comprising a hardened material of the resin composition according to claim 1.

6. A semiconductor light-emitting device, wherein
the semiconductor light-emitting device has on a substrate thereof an optical semiconductor element and a reflector which is arranged around the optical semiconductor element and reflects a light from the optical semiconductor element to a prescribed direction, and
a light reflecting surface of the reflector comprises a hardened material of the resin composition according to claim 1.

7. The resin composition according to claim 1, wherein the inorganic filler is titanium oxide.

8. The resin composition according to claim 1, wherein the composition comprises 0.1 to 20 parts by mass of the trialkoxy silane compound relative to 100 parts by mass of the olefin resin.

9. The resin composition according to claim 1, wherein the resin composition is an electron beam-hardenable resin composition.

10. The resin composition according to claim 3, wherein the flow improver is triallyl isocyanurate.

11. A resin composition comprising:
an olefin resin that is at least any one of polypropylene, polymethylpentene, and a homopolymer of polyethylene,
a trialkoxy silane compound containing an alkenyl group with a carbon number of 1 to 20, and
titanium oxide.

12. The resin composition according to claim 1, wherein the olefin resin is polymethylpentene.

13. The resin composition according to claim 11, wherein the olefin resin is polymethylpentene.

14. The resin composition according to claim 1, wherein the composition comprises 3 to 20 parts by mass of the trialkoxy silane compound relative to 100 parts by mass of the olefin resin.

15. The resin composition according to claim 11, wherein the composition comprises 3 to 20 parts by mass of the trialkoxy silane compound relative to 100 parts by mass of the olefin resin.

16. The resin composition according to claim 1, wherein the average particle diameter of the inorganic filler is from 0.21 μm to 100 μm.

17. The resin composition according to claim 11, wherein the average particle diameter of the titanium oxide is from 0.21 μm to 100 μm.

* * * * *